Figure 1:
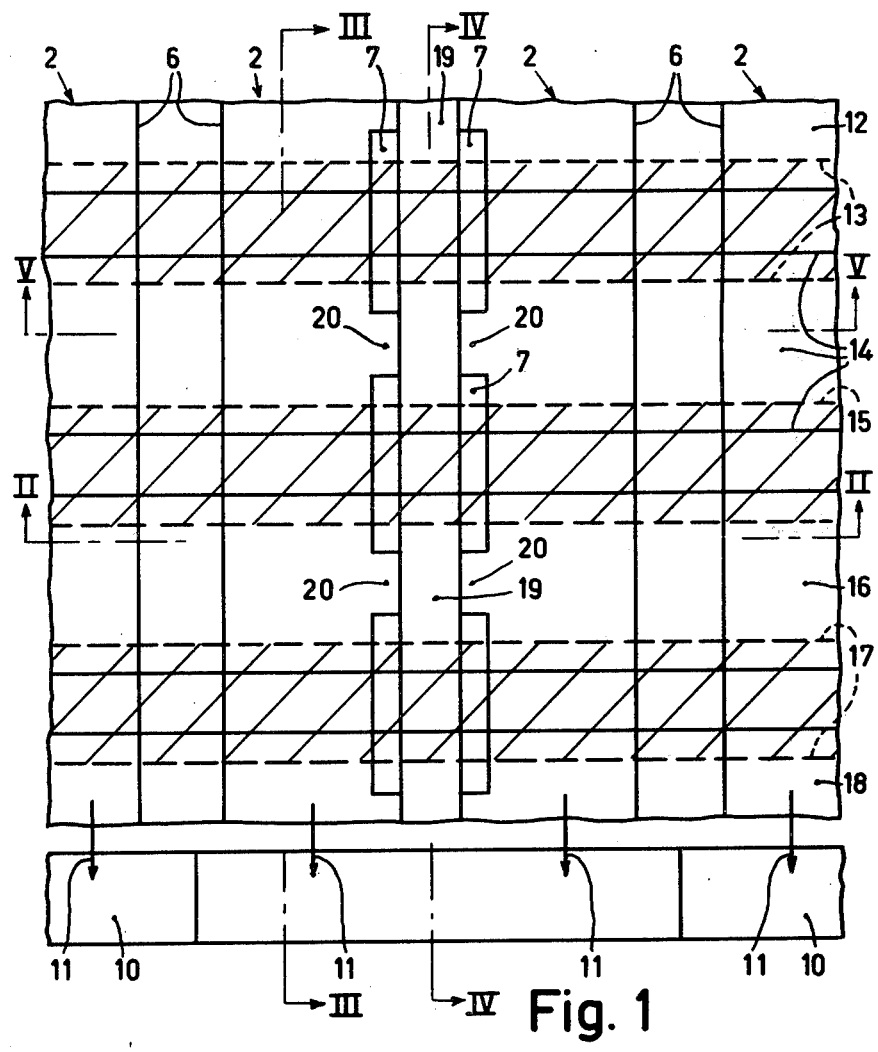

United States Patent [19]
van Santen et al.

[11] 4,028,716
[45] June 7, 1977

[54] BULK CHANNEL CHARGE-COUPLED DEVICE WITH BLOOMING SUPPRESSION

[75] Inventors: Johannes Gerrit van Santen; Marnix Guillaume Collet, both of Eindhoven, Netherlands

[73] Assignee: U.S. Philips Corporation, New York, N.Y.

[22] Filed: Aug. 19, 1974

[21] Appl. No.: 498,594

[30] Foreign Application Priority Data

Aug. 23, 1973 Netherlands ............... 7311600

[52] U.S. Cl. .................... 357/24; 357/30; 307/221 D
[51] Int. Cl.² ............ H01L 29/78; H01L 27/14; H01L 31/00; G11C 19/28
[58] Field of Search .......... 357/24, 30; 307/221 C, 307/221 D, 304, 311

[56] References Cited

UNITED STATES PATENTS

| | | | |
|---|---|---|---|
| 3,771,149 | 11/1973 | Collins et al. ............... | 357/24 |
| 3,792,322 | 2/1974 | Boyle et al. ............... | 357/24 |
| 3,863,065 | 1/1975 | Kosonocky et al. ............... | 357/24 |
| 3,866,067 | 2/1975 | Amelio ............... | 357/24 |
| 3,896,474 | 7/1975 | Amelio et al. ............... | 357/24 |
| 3,896,485 | 7/1975 | Early ............... | 357/24 |

OTHER PUBLICATIONS

Sequin, "Blooming Suppression in Charge Coupled Area Imaging Devices" Bell System Tech. Journal vol. 51 (Oct. 1972), pp. 1923–1926.
Amelio, "Physics and Applications of Charge Coupled Devices" IEEE International Convention (Mar. 1973) Tech. Papers vol. 6, Paper No. 1/3.

*Primary Examiner*—William D. Larkins
*Assistant Examiner*—Gene M. Munson
*Attorney, Agent, or Firm*—Frank R. Trifari; Jack Oisher

[57] ABSTRACT

The invention relates to a charge-coupled device in which the information-forming charge carriers which are generated by absorption can be stored and/or transported mainly in the interior of the semiconductor layer. In order to prevent blooming effects as a result of local overexposure the lateral boundary of the semiconductor layer is constructed so that at least locally an overflow for excessive majority charge carriers is present in said boundary and at the same time a satisfactory drain of generated minority charge carriers is ensured.

13 Claims, 17 Drawing Figures

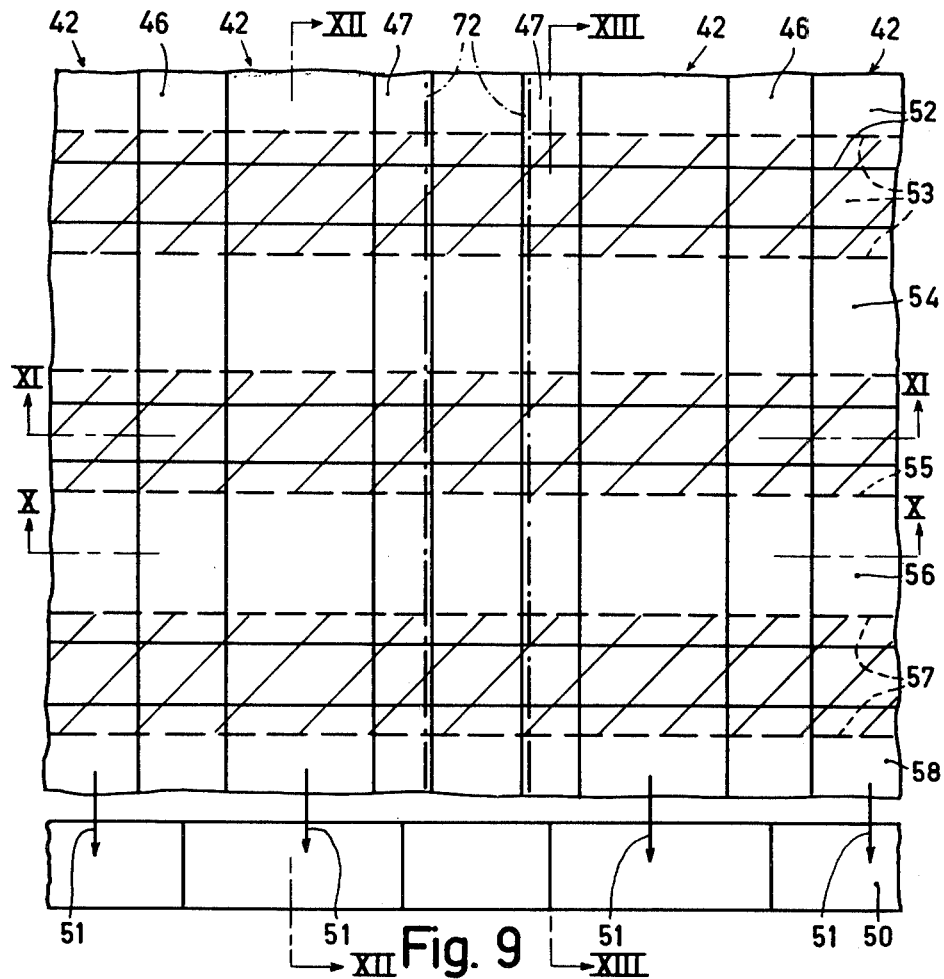
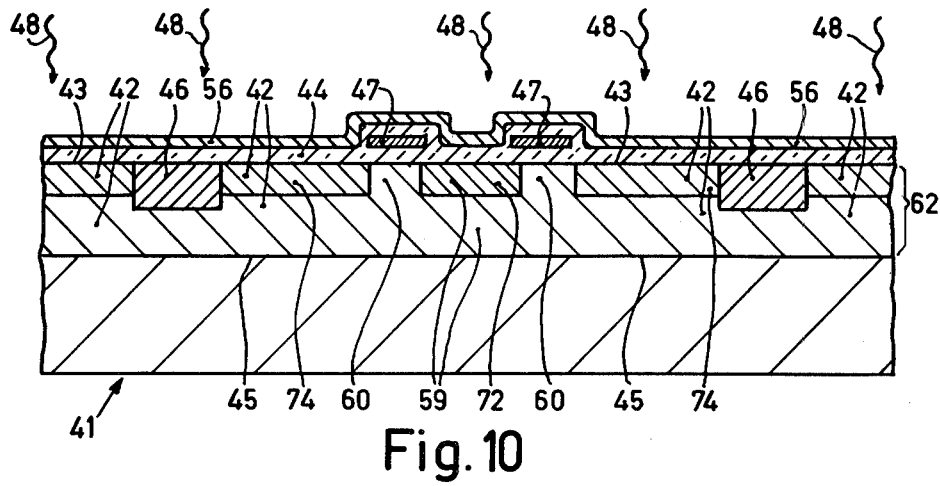
Fig. 9
Fig. 10

BULK CHANNEL CHARGE-COUPLED DEVICE WITH BLOOMING SUPPRESSION

The invention relates to a charge-coupled device, in particular a picture sensor destined for converting an electromagnetic signal into an electric signal, having a semiconductor body comprising a semiconductor layer of one conductivity type, in which means are present to isolate the semiconductor layer electrically from the surroundings, and said layer has a thickness and a doping concentration at which a depletion zone can be obtained throughout the thickness of the semiconductor layer by means of an electric field while avoiding breakdown, an electrode system being present at a surface of the semiconductor body for capacitively producing electric fields in the semiconductor layer as a result of which potential wells separated from each other by a potential barrier are locally formed in the semiconductor layer, in which wells information can be stored in the form of electric charge consisting of majority charge carriers which can be generated in the semiconductor body under the influence of radiation, it being furthermore possible to produce electric fields by means of the electrode system for transporting the charge through the semiconductor layer in a direction parallel to the layer to means for reading the charge.

In this case the charge transport of at least the last quantities of charge still to be transferred takes place in the interior of the semiconductor layer. As a result of this the transport efficiency and the transport rate may be comparatively high as compared with the transport efficiency and transport rate, respectively, in charge-coupled devices in which the transport of the charge takes place entirely along the surface of the semiconductor body.

It is to be noted that majority charge carriers are to be understood to mean hereinafter that type of charge carriers of which the concentration in the absence of electric fields in the semiconductor layer is larger, for example 10 times or preferably even at least 100 times larger than the concentration of charge carriers of the other type, the so-called minority charge carriers.

A charge-coupled device of the type described in the preamble is described inter alia in the Dutch Patent Application 71.14770 published on May 1, 1973 and in copending application Ser. No. 450,996, filed Mar. 14, 1974.

As already described in the said applications, the electrode system in most of the cases will be formed by a number of electrodes arranged one behind the other and consisting of a suitable conductive material which is separated from the semiconductor body by an intermediate layer of insulating material.

The semiconductor body may comprise an epitaxial surface layer of one conductivity type provided on a substrate of the opposite conductivity type, the semiconductor layer being formed by an island-shaped part of the epitaxial layer. The means isolating the semiconductor layer may comprise an isolating zone of the opposite conductivity type which, viewed on the surface, surrounds the semiconductor layer substantially entirely. A number of such semiconductor layers which are substantially parallel to each other and are separated from each other by the said isolation zones may be formed in the epitaxial layer, in which the electrodes, in a direction transverse to the direction of charge transport, may extend over all the semiconductor layers and may form a charge-coupled device each time with an underlying semiconductor layer. Such a structure may be used, for example, as a two-dimensional image pick-up element in camera tubes in which a two-dimensional radiation pattern which is projected on the surface of the semiconductor body is converted into a two-dimensional pattern of charge packets which can be formed and stored, respectively, in the potential wells.

It is to be noted that the term "potential well" and the term "potential barrier" should be understood to mean that a majority charge carrier present at the area shows a minimum and a maximum, respectively, in potential energy.

It will be obvious that the maximum size of the charge packets is determined, besides by the lateral dimensions of the semiconductor layer and the width of the electrodes, inter alia by the depth of the potential wells and/or the height of the potential barrier. The maximum quantity of charge will generally be given by the charge which is necessary to fill the potential well. In the case in which the number of available majority charge carriers is larger than said maximum quantity as a result of local overexposure, it will not be possible to store the excessive charge carriers at the area, but they will flow as excessive charge carriers through the semiconductor layer to a next potential well which is not yet filled entirely and will be stored there. In the case of a very strong overexposure, the whole semiconductor layer may even be filled.

The result therefore of such an overexposure which is only very local in, for example, televisionlike applications may be that a comparatively large white stripe or surface is formed on the screen. This effect, sometimes referred to by the name of "blooming," often proves to seriously impede a satisfactory operation of the device in practice.

In other applications, for example digital applications, such a spreading of charge carriers as a result of local overexposure may also adversely influence the operation of the device.

One of the objects of the present invention is therefore to provide a charge-coupled device of the type described in the preamble in which the spreading of excessive charge carriers through the semiconductor layer as a result of local overexposure is avoided at least for the greater part, in which the term excessive charge carriers should be understood to mean the number of charge carriers which is available above the maximum number of charge carriers at which blooming effect does just not occur.

The invention is based inter alia on the recognition that the spreading of charge carriers over the semiconductor layer as a result of local overexposure can be prevented by removing said charge carriers from the semiconductor layer in a direction transverse to the direction of charge transport by incorporating at least locally an overflow for charge carriers on the sides of the semiconductor layer.

A charged coupled divice of the type described in the preamble is therefore characterized according to the invention in that for drawing excessive majoriy charge carriers from the semiconductor layer the semiconductor body comprises a drain zone of one conductivity type which extends in the semiconductor body beside and parallel to the semiconductor layer and which can be separated electrically from the semiconductor layer by means of the said means isolating the semiconductor layer with which a potential barrier can be formed between the semiconductor layer and the drain zone, which potential barrier is at least locally lower than the said potential barrier between two successive potential wells in the semiconductor layer.

Since the potential barrier between the semiconductor layer and the drain zone by means of the isolating means is therefore chosen to be sufficiently low, an overflow formed by said barrier can be obtained at least locally so that excessive majority charge carriers can be drained via said overflow in the drain zone before spreading over the semiconductor layer.

Upon absorption of radiation, for example, in the semiconductor layer during an integration period, minority charge carriers are also generated in addition to majority charge carriers. In the case in which the device is operated in the accumulation mode in which the majority charge carriers are attracted by the electrode system at the area of the potential wells and can be collected at the surface of the semiconductor body, the minority charge carriers which are repelled by the electrode system can be drained, for example, via the substrate of the opposite conductivity type. However, in the case in which the device is operated so that the generated majority charge carriers are stored in the interior of the semiconductor layer also during the integration period in which the radiation pattern is recorded, the generated minority charge carriers can be partly attracted to the surface of the semiconductor body and be collected there instead of being drained directly via the substrate.

A first type of preferred embodiment of a semiconductor device according to the invention is therefore characterized in that the means isolating the semiconductor layer comprise a semiconductor zone, hereinafter termed isolation zone, of the opposite conductivity type which, viewed on the surface, extends in the semiconductor body parallel to and beside the semiconductor layer and separates the semiconductor layer and the drain zone laterally from each other and which, for draining excessive majority charge carriers, shows at least locally channels of one conductivity type which interconnect the semiconductor layer and the drain zone and have a thickness and a doping concentration at which a depletion zone can be applied throughout the thickness of the channel by means of an electric field so as to obtain a potential barrier between the semiconductor layer and the drain zone which is lower than the said potential barrier in the semiconductor layer between two successive potential wells.

It is to be noted that the said semiconductor isolation zone may therefore serve to isolate the semiconductor layer, to provide an overflow for excessive majority charge carriers, and to drain generated minority charge carriers.

A second type of preferred embodiment of a charge-coupled device according to the invention is characterized in that the semiconductor layer and the drain zone are separated by an intermediate region of one conductivity type which has a thickness and a doping concentration at which a depletion zone can be obtained throughout the thickness of the intermediate region by means of an electric field while avoiding breakdown, in which an electrode, hereinafter referred to as intermediate electrode, is present on the surface of the body and by means of which an electric field can be formed capacitively in the intermediate region so as to obtain the said potential barrier between the drain zone and the semiconductor layer, the semiconductor layer being bounded on the oppositely located side by a zone of the opposite conductivity type which, viewed on the surface, extends in the semiconductor body beside the semiconductor layer.

Therefore, in this type of preferred embodiment the semiconductor layer on the side near the drain zone is not bounded by a zone of the opposite conductivity type. At first sight, such a structure cannot or at least hardly be used as a picture sensor, since generated minority charge carriers will partly be attracted by the said electrode with which actually a potential barrier for majority charge carriers and hence a potential well for minority charge carriers is formed. The minority charge carriers attracted by the electrode will therefore at first sight be collected at the area of the semiconductor region between the semiconductor layer and the drain zone and hence can impede a satisfactory operation of the device.

However, the invention is furthermore based on the surprising recognition that the minority charge carriers can be conveyed from said semiconductor region via the semiconductor layer in a direction transverse to the direction of charge transport to the oppositely located side of the semiconductor layer in the semiconductor region of the opposite conductivity type and can be drained there. Such a charge transport of minority charge carriers is possible via the semiconductor layer at the area where the potential barrier for majority charge carriers is present in the layer.

The invention will now be described in greater detail with reference to a few embodiments and the accompanying diagrammatic drawings, in which FIG. 1 is a plan view of a part of a charge-coupled device according to the invention.

Figure 2:
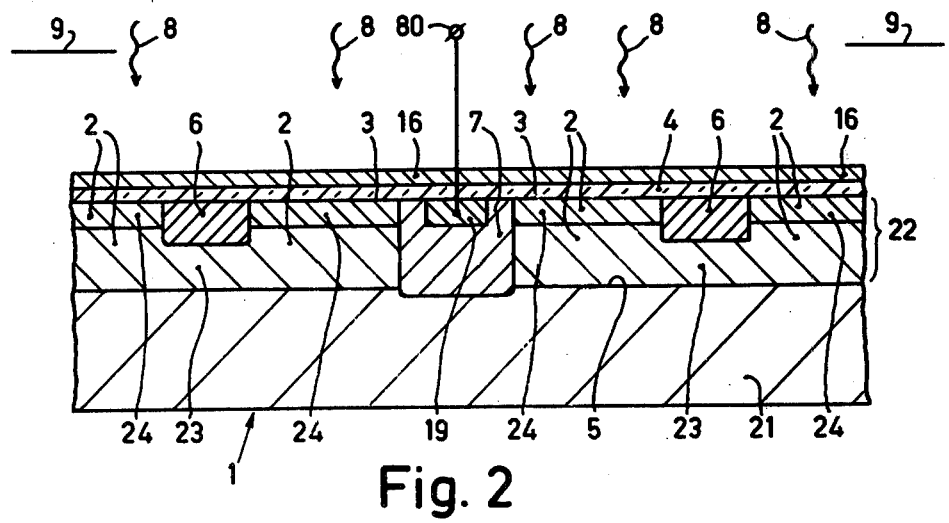
Figure 3:
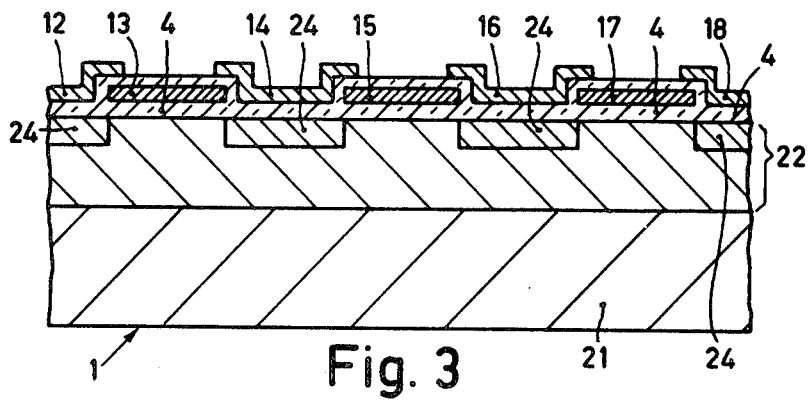
Figure 4:
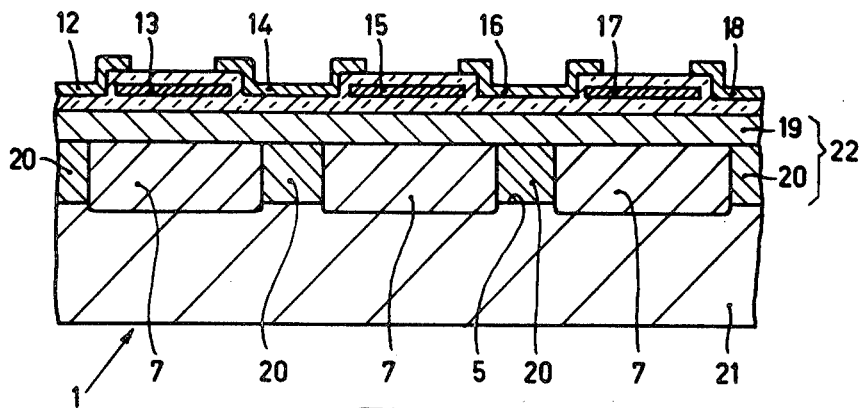
Figure 8:
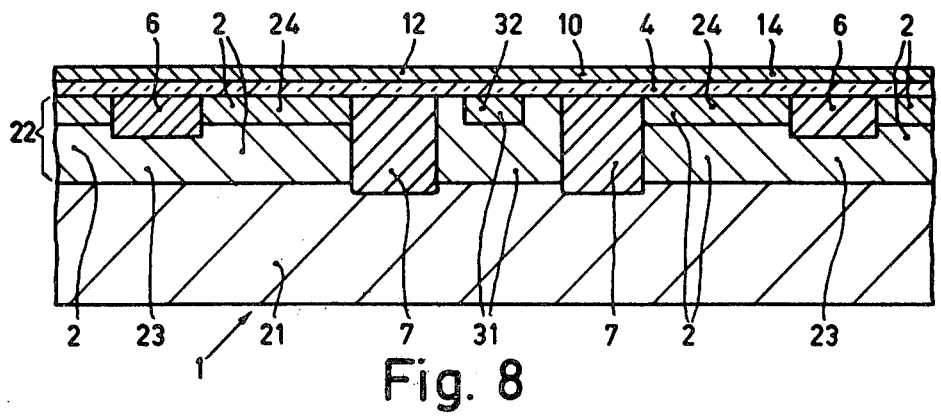
Figure 6:
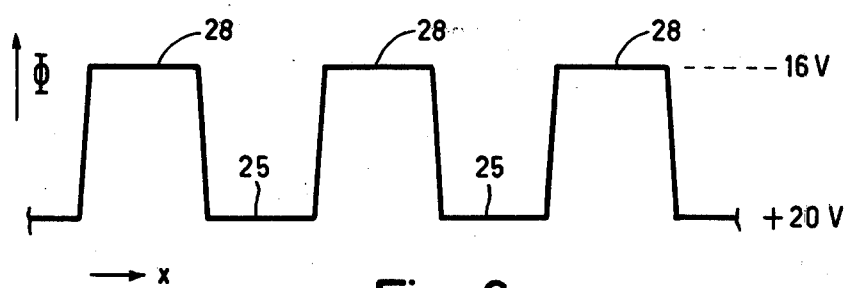
Figure 7:
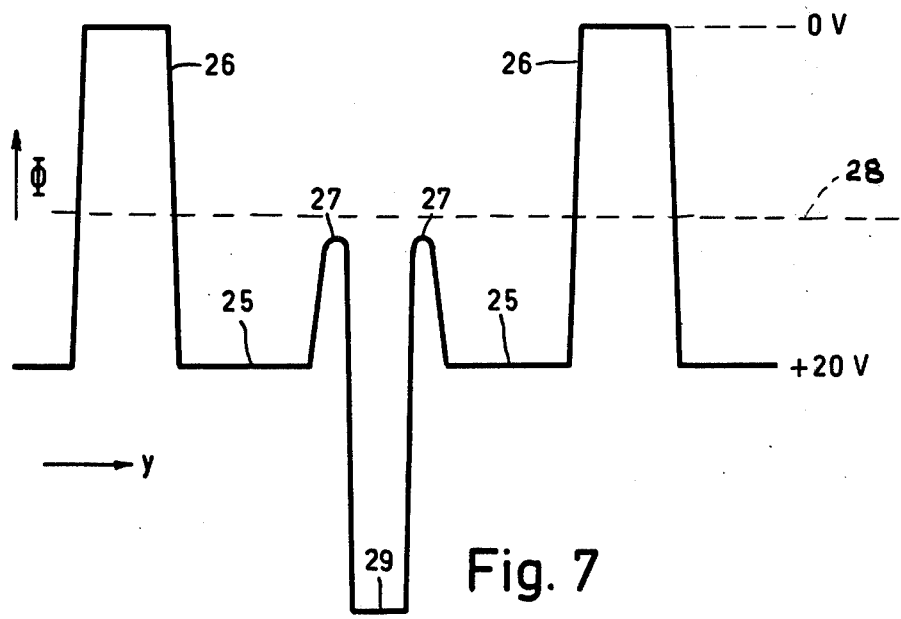
Figure 5:
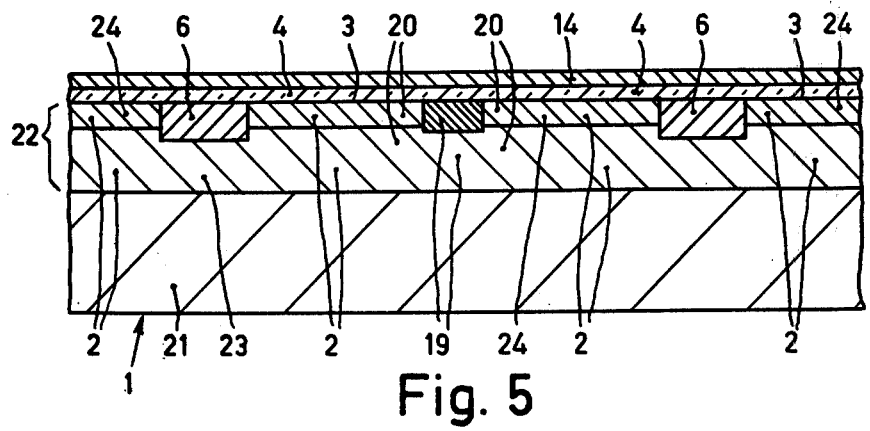
Figure 11:
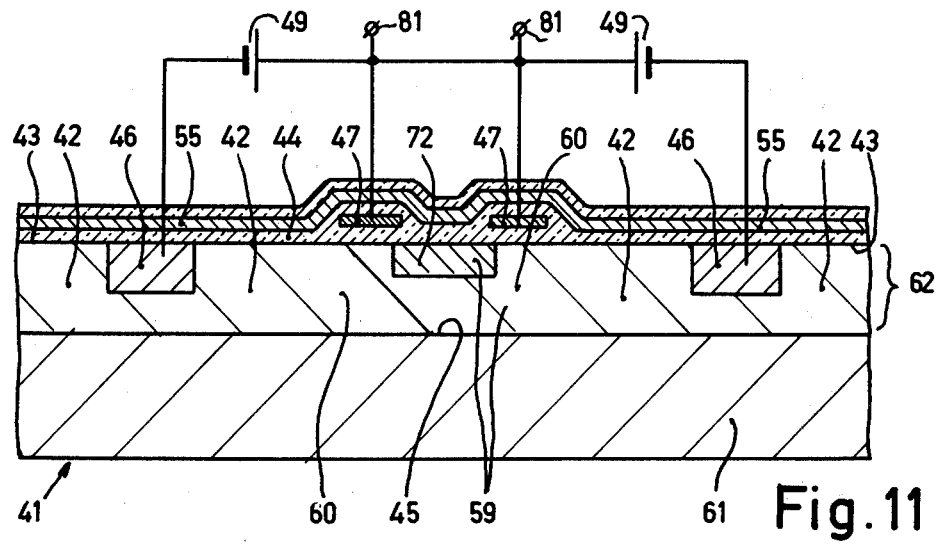
Figure 12:
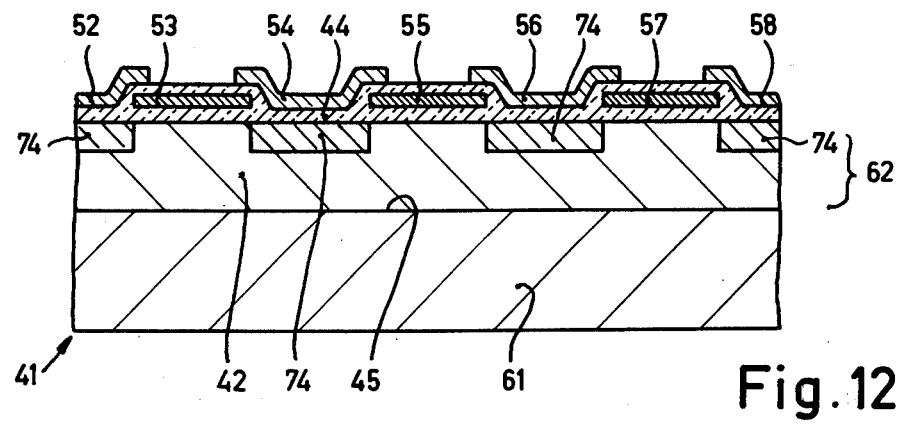
Figure 13:
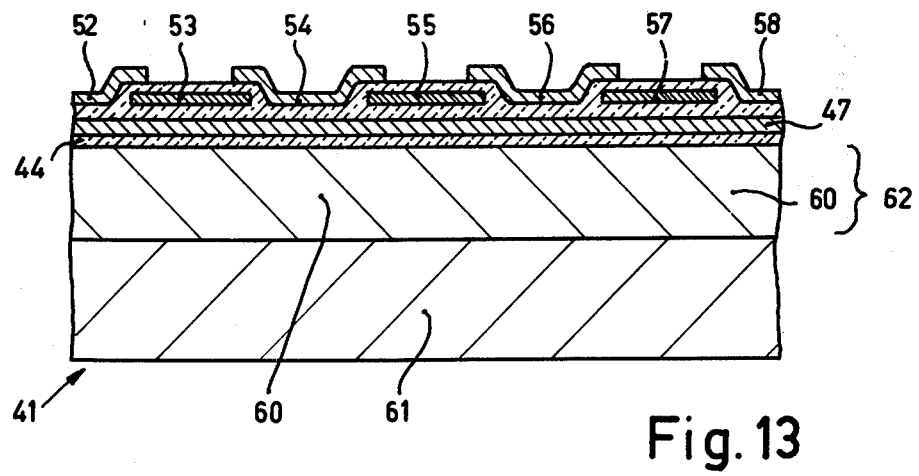
Figure 14:
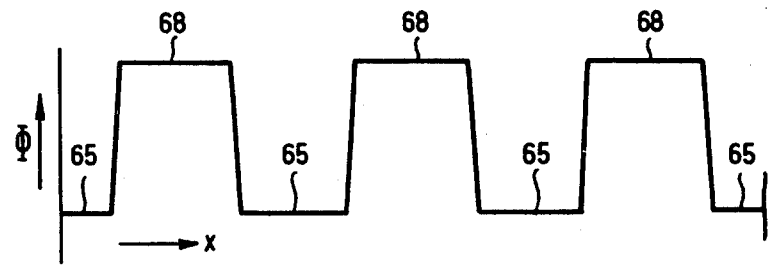
Figure 15:
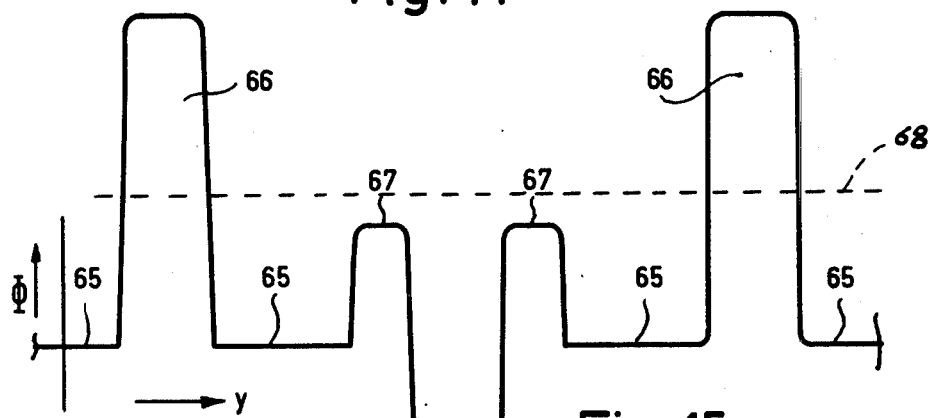
Figure 16:
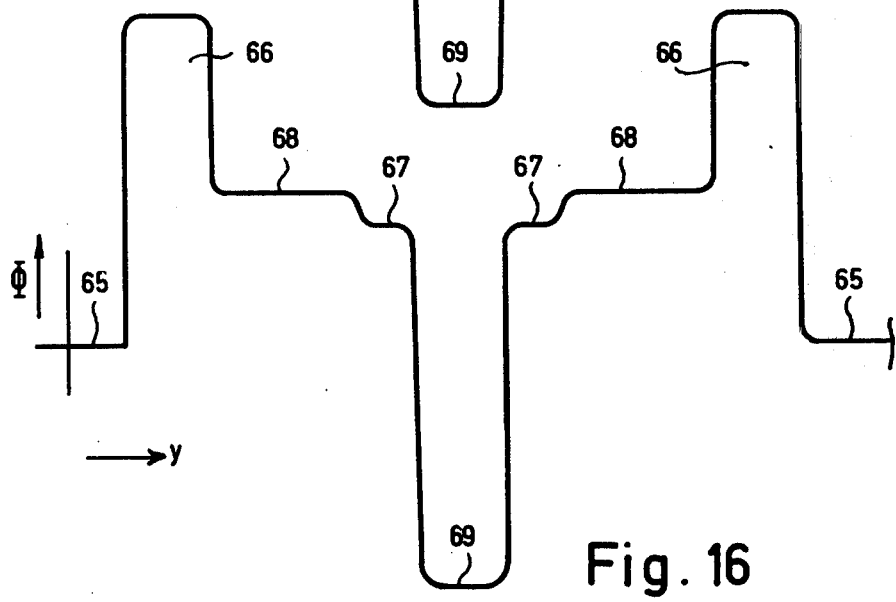

FIG. 2 is a cross-sectional view taken on the line II—II of the device shown in FIG. 1, and FIG. 3 is a cross-sectional view taken on the line III—III of the device shown in FIG. 1, and FIG. 4 is a cross-sectional view taken on the line IV—IV of the divice shown in FIG. 1, FIG. 5 is a cross-sectional view of the device taken on the line V—V of FIG. 1, FIG. 6 shows the variation of the potential on the line III—III of FIG. 1 during operation of the device, FIG. 7 showns the variation of the potential on the line V—V of FIG. 1 during operation of the device, FIG. 8 is a cross-sectional view corresponding to the cross-sectional view of FIG. 2 of a second embodiment of a charge-coupled device according to the invention, FIG. 9 is a plan view of a part of a further charge-coupled device according to the invention, FIG. 10 is a cross-sectional view taken on the line X—X of FIG. 9 of the device shown in FIG. 9, FIG. 11 is a cross-sectional view taken on the line XI—XI of the device shown in FIG. 9, FIG. 12 is a cross-sectional view taken on the line XII—XII of the device shown in FIG. 9, FIG. 13 is a sectional view taken on the line XIII—XIII of the device shown in FIG. 9, FIG. 14 shows the potential variation on the line XII—XII of FIG. 9 during operation of the device, FIG. 15 shows the potential variation on the line X—X of FIG. 9 during operation of the device, FIG. 16 shows the potential variation on the line XI—XI of FIG. 9 during operation of the device.

Figure 17:
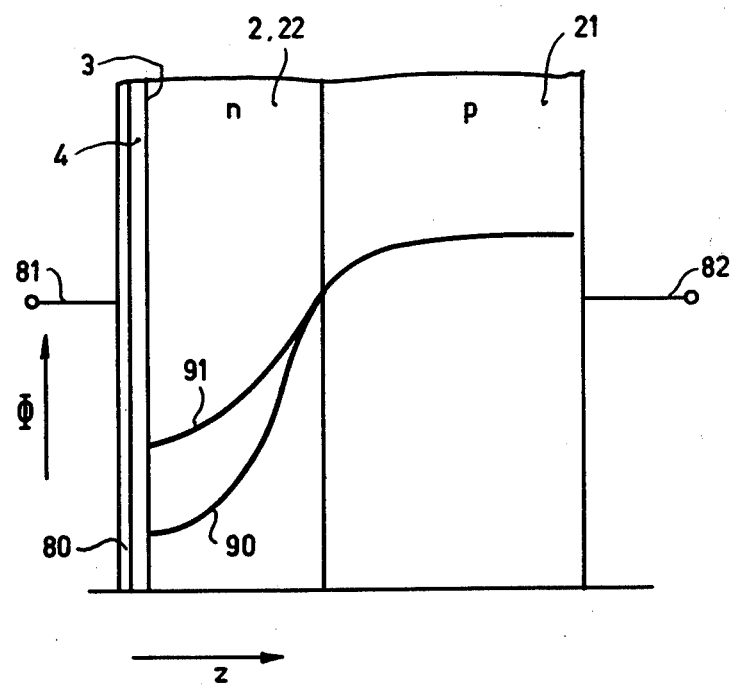

FIG. 17 shows potential variation into the semiconductor for operation wherein the majority carriers are stored at least partly at the surface.

It is to be noted that the figures are not drawn to scale and that some components of the structures shown are considerably exaggerated as compared with other components for reasons of clarity.

FIG. 1 is a plan view of a part of a charge-coupled device which may be used inter alia as a two-dimensional picture sensor in camera tubes for converting electromagnetic signals into electric signals.

The device comprises a silicon body 1 having therein a number of semiconductor layers of n-type silicon which are each denoted by reference numeral 2. Said layers 2 of which only four are shown in FIG. 1 and 2 form a number of parallel lines of the picture pick-up element or sensor.

The semiconductor layers 2 may be isolated from the surroundings with the aid of means which include inter alia an isolating layer 4 of silicon oxide provided on the surface 3 of the semiconductor body as well as the p-n junction 5 on the side of the semiconductor layers 2 present opposite to the surface 3. Said means, hereinafter referred to as isolating means, also include the separation isolations 6, 7 by means of which the semiconductor layers can be isolated from each other by applying a voltage in the reverse direction of a sufficient value across the p-n junctions between the semiconductor layers 2 and the isolation zones 6, 7.

The picture sensor belongs to the type of charge-coupled devices in which information in the form of majority charge carriers can be transported and/or stored mainly in the interior or bulk of the semiconductor body. For that purpose each layer 2 shows a thickness and a doping concentration at which a depletion zone can be obtained throughout the thickness of the layer 2 by means of an electric field while avoiding breakdown.

An electrode system comprising a number of electrodes which are arranged one behind the other and of which the electrodes 12-18 are shown in the figures is present on the surface 3 of the semiconductor body 1. The electrodes which in the present embodiment are isolated from the semiconductor material of the semiconductor body 1 by the isolating layer 4 may also be separated herefrom by means of a rectifying junction, for example, a Schottky junction.

By means of the electrode system, electric fields can be produced capacitively in each semiconductor layer 2 as a result of which potential wells which are separated from each other by a potential barrier are locally formed in the layer 2.

Information in the form of electric charge consisting of majority charge carriers which can be generated in the semiconductor body under the influence of electromagnetic radiation 8 can then be stored in the potential wells. The electromagnetic radiation 8 which is incident on the semiconductor body may form a radiation pattern which is projected on the surface 3 of the semiconductor body 1 with the aid of diagrammatically shown means 9 (see FIG. 2) which may comprise, for example, a system of lenses or a diaphragm.

By means of the electrode system 12-18, further electric fields may be produced in the semiconductor layer 2 after taking up the radiation picture or pattern 8 for transporting the charge through the layer 2 in a direction parallel to the layers to means 10 (see FIG. 1) for reading the charge. Said means which do not form the subject matter of the present invention and are therefore shown only diagrammatically in the form of a block diagram may comprise, for example, a storage matrix formed by a charge-coupled device. The majority charge carriers generated in the semiconductor layers 2 and in the form of charge packets of which the size forms a measure of the quantity of radiation 8 which is each time absorbed locally in the layers 2, can be transported in the storage matrix and be further read there, as is shown diagrammatically in FIG. 1 by the arrows 11. While said radiation packets are read, for example, one by one, a fresh radiation pattern may be recorded again in the semiconductor layers 2. It is to be noted that the reading means 10 are not shown in FIGS. 2, 3 and 4 for reasons of clarity.

Moreover it is to be noted that the oxide layer 4 is not shown in FIG. 1, while the edges of the electrodes 13, 15 and 17 which are present below the edges of the electrodes 12, 14 and 16 and 18 are denoted in broken lines.

In order to prevent crosstalk between information packets in successive potential wells in a semiconductor layer 2, in which as a result of local overexposure during recording the radiation pattern 8 a potential well is fully filled and in which majority charge carriers would flow to adjacent potential wells, the semiconductor body 1 comprises an n-type drain zone 19 for draining excessive majority charge carriers from the layers 2.

As is shown inter alia in FIG. 1 the drain zone 19 extends in the semiconductor body 1 beside and parallel to the semiconductor layers 2. It is to be noted that the zone 19 constitutes a common drain zone for the layers 2 present in the centre of the figure on either side of the isolation zone 7 and that the drain zones for draining the excessive majority charge carriers from the layers 2 which are shown only partly on the left-hand and right-hand edge of the part shown in FIGS. 1 and 2 are no longer shown in the figure.

The drain zone 19 may be separated electrically from an adjacent layer 2 with the aid of the means 7 isolating the layers 2 and with which a potential barrier can be formed between the layer 2 and the drain zone 19 which barrier is at least locally lower than the said potential barrier between two successive potential wells in the semiconductor layer 2.

As will become apparent hereinafter when the operation of the device will be described in greater detail, the comparatively low potential barrier (for majority charge carriers) serves as an overflow via which excessive majority charge carriers can be passed into the drain zone and/or be drained before filling the potential wells in the semiconductor layer 2 entirely.

In the present embodiment, moreover, a good drain of generated minority charge carriers can be obtained in that the means isolating the semiconductor layer 2 comprise a p-type semiconductor zone 7, hereinafter referred to as isolation zone. Viewed on the surface, said isolation zone extends parallel to and beside the semiconductor layers 2 and forms a lateral separation between the semiconductor layers 2 and the drain zone 19. In order to obtain the said overflow for draining the excessive majority charge carriers from the adjacent semiconductor layers 2, the isolation zone 7 locally comprises channels 20 of the same conductivity type as the semiconductor layer 2 and the drain zone 19, consequently of the n-type. The channels 20 connect the semiconductor layers 2 and the drain zone 19 locally and, viewed on the surface, have a thickness and a doping concentration at which a depletion zone can be formed throughout the thickness of the channels 20 by means of an electric field so as to obtain the comparatively low potential barrier between the semiconductor layer 2 and the drain zone 19 which is lower than the said potential barrier between two successive potential wells in the semiconductor layer. In this embodiment, therefore, the excessive majority charge carriers can be drained via the channels in the isolation zone while generated minority charge carriers can be drained via the isolation zone itself.

In the present embodiment the layers 2 are formed by n-type surface regions which adjoin the surface 3 of the semiconductor body 1 and which on the oppositely located side change into a p-type region 21, hereinafter termed substrate, via the p-n junction 5, the isolation zone 7 extending from the surface 3 down into the substrate 21.

The surface regions forming the semiconductor layers consist of island-shaped parts of an n-type epitaxial silicon layer 22 which is provided on the p-type silicon substrate 21.

The isolation zone 7 is formed by a p-type surface zone which extends throughout the thickness of the exitaxial layer 22 and, viewed on the surface 3, locally shows interruptions forming the said channels 20 between the semiconductor layer 2 and the drain zone 19. The substrate 21 may be used as a common electric connection for the parts of the isolation zone 7 interrupted by the channels 20 so that, in spite of the interruptions 20, the wiring may nevertheless be maintained simple.

As is furthermore apparent inter alia from FIG. 2, the drain zone 19 is formed by an n-type surface zone provided in the epitaxial layer 22. Except at the area of the interruptions 20 in the isolation zone 7 between the semiconductor layers 2 and the drain zone 19, the said surface zone is fully surrounded in the semiconductor body by the p-type isolation zone 7. As a result of this the structure of the device may be compact, which is of advantage since it is often desired that the number of radiation-sensitive pick-up elements per surface unit be as large as possible. The compactness of the device is moreover increased by using the surface zones 6 as isolation zones which extend in the semiconductor body 1 only over a part of the thickness of the epitaxial layer 22. By applying a sufficiently large voltage to the zones 6, a depletion zone can be formed in the regions of the epitaxial layer 22 denoted by 23 (see FIG. 2) by means of an electric field which isolates the semiconductor layers 2 from each other.

As shown in FIGS. 1 and 2 the electrodes 12–18 which constitute a common electrode system for all the semiconductor layers 2 extend above all the semiconductor layers in a direction transverse to the direction of charge transport in the layers 2 across the semiconductor body 1 and are separated therefrom by the silicon oxide layer 4. The electrodes 13, 15, 17 and so on are formed by layers of polycrystalline silicon which, as shown in FIG. 3, are embedded entirely in the silicon oxide layer 4 except of course at the area of possible electric connections. Viewed on the surface 3, the electrodes 12, 14, 16, 18 and so on which in the present embodiment are manufactured from aluminum but which, of course, may also consist of another suitable material, overlap the electrodes 13, 15, 17 partly and are separated from said electrodes by the isolating layer 4.

As is shown inter alia in FIG. 4, the electrodes 12, 14, 16 and 18 are present above surface zones 24 which are provided in the epitaxial layer 22 and have the same conductivity type as and a higher doping than the epitaxial layer 22. Such zones which inter alia form the subject matter of the already mentioned Ser. No. 450,996 application produce on the one hand, together with the electrode situated above them, a relatively large capacity so that the operation of the device is favorably influenced, and on the other hand cause that the device can be operated with only two clock voltage sources as a two-phase system in which, for example, the electrodes 13, 14, 17 and 18 are connected to the same clock-voltage source and the electrodes 12, 15 and 16 to the other clock voltage source.

For the manufacture of the charge-coupled device in the present embodiment the methods generally known in semiconductor technology may be used.

Starting material is the p-type silicon substrate 21 of which the thickness is approximately 200 $\mu$m and which shows an acceptor concentration of approximately $2 \times 10^{14}$.

The n-type epitaxial silicon layer 22 is deposited on the substrate 21 in a thickness of approximately 5 $\mu$m and a doping concentration of approximately, for example, $6 \times 10^{14}$ donor atoms/ccm. The lateral dimensions of the substrate and the epitaxial layer are furthermore assumed to be large enough to be able to comprise the whole device with possible further circuit elements.

The p-type isolation zones 6 and 7 may be provided in the layer 22 by means of the usual photomasking methods, in which the surface concentration of the zone 7 can advantageously be chosen to be sufficiently low, for example, approximately $10^{16}$ atoms/ccm, so as to increase the breakdown voltage of the p-n junction between the isolation zone 7 and the n-type drain zone which may then be provided in the isolation zone 7 by means of the conventional masking and doping methods. The surface concentrations of the regions 6 and 19 are not critical and may lie between respectively, $10^8 - 10^{19}$ atoms/ccm and $10^{10} - 10^{20}$ atoms/ccm.

The electrodes 13, 15, 17 and so on are then provided on the surface 3 of the semiconductor body 1 by depositing polycrystalline silicon on the oxide layer 4 whose thickness is approximately 0.1 $\mu$m. Said electrodes constitute a mask in the subsequent doping step in which the more highly doped n-type surface zones 24 are provided, for example, by means of ion implantation of donors. The thickness of the surface zones 24 is approximately 0.5 $\mu$m and the doping concentration is approximately $10^{16}$ atoms per cm$^3$. With these thicknesses and doping concentrations, the greater part by far of the information-forming majority charge carriers can each time be stored in the regions 24 during operation and hence very closely to the surface 3.

After providing the surface zones 24, the aluminum electrodes 12, 14, 16, 18 and so on may furthermore be provided in the usual manners, possibly simultaneously with further wirings to be provided on the semiconductor body.

The operation of the charge-coupled device according to the present embodiment will now be described in greater detail also with reference to FIGS. 6 and 7. These figures show the variation of the potential $\phi$ as a function of the coordinates $x$ and $y$, respectively, in which $x$ denotes a place along the line III—III in FIG. 1 and $y$ denotes a place along the line V—V of FIG. 1.

It is assumed that the potential of the substrate 21 is considered as a reference level and assumed to be equal to substantially zero volt. In the case in which a voltage of approximately 20 volts is applied to the semiconductor layers 2 and a voltage of approximately 10 volts to the electrodes, the semiconductor layers 2 may be depleted throughout their thickness. The semiconductor layers 2 may be biased by means of a suitable electrical connection (not shown) and which may be constituted, for example, by an output contact of the device belonging to the reading means for reading the charge packets. From an analysis of the variation of the potential $\phi$ it appears that, viewed in the direction of thickness, a potential minimum (for electrons) occurs at a distance of approximately 2 $\mu$m from the surface 3 of the semiconductor body 1. Moreover it appears that at said distance the potential minimum below the electrodes 12, 14, 16 and 18 is approximately 4 volts lower than the minimum below the electrodes 13, 15 and 17 as a result of the presence of the more highly doped n-regions 24 below the electrodes 12, 14, 16, and 18.

Therefore, at a distance of approximately 2 $\mu$m from the surface 3 the potential variation shown in FIG. 6 is obtained as a function of the place $x$, with potential wells 25 which are present below the more highly doped regions 24 and below the aluminum electrodes 12, 14, 16 and 18, and with potential barriers 28 which are present below the polycrystalline electrodes 13, 15 and 17 and which show a height of approximately 4 volts with respect to the potential wells.

During picking up the radiation pattern 8, the signal to be recorded may be integrated below all the aluminum electrodes 12, 14, 16, 18 below which a potential well is present as is shown in FIG. 6, the electrons generated in the layers 2 being collected in the nearest potential well.

In order to prevent that as a result of local overexposure of the device one or more potential wells are filled with electrons to such an extent that spreading of charge over the layers 2 occurs, the potential barrier from the semiconductor layer 2 to the drain zone 19 should be slightly lower than 4 volts. This is achieved by locally providing the isolation zone 7 below the aluminum electrodes 12, 14, 16, 18 and so on with the narrow interruptions 20 having a width of approximately 5 $\mu$m. Besides said width, the potential in the interruptions also depends inter alia on the voltage at the electrodes 12, 14, 16 and so on, the voltage at the substrate 21, and on the doping concentration in the interruptions and the potential of the drain zone 19. In the present embodiment in which the doping concentration in the interruptions 20 is substantially equal to the doping concentration below the electrodes 12, 14, 16 and so on, a potential barrier of approximately 3.8 volts may be obtained in the interruptions 20 when a voltage of approximately 40 volts is applied to the drain zone 19.

It is to be noted that said potential barrier is formed in particular via the isolation zone 7 in that the width of the interruptions at the given voltages is chosen to be sufficently narrow.

The potential pattern which can be obtained in this manner for example along the line V-V in FIG. 1 is shown diagrammatically in FIG. 7. Reference numeral 25 in this figure denotes potential wells which are present in the semiconductor layers 2 on either side of the drain zone 19 and below the electrode 14. On the left-hand and on the right-hand sides of the figure the potential wells 25 are bounded by high potential barriers 26 which can be obtained by means of the isolation zones 6, for example, by connecting said zones conductively to the substrate 21 — and hence to the isolation zone 7. The potential wells 25 are bounded on the inside by the potential barriers 27 in the interruptions 20. Said potential barriers are approximately 0.2 volt lower than the potential barriers 28 shown in FIG. 6 between successive potential wells 25 in the same semiconductor layer 2. As a result of this, before flowing from a filled (or substantially filled) potential well 25 to an adjacent potential well 25, electrons can flow via the lower potential barrier 27 into the potential well 29 formed by the drain zone 19 and then be drained via the drain zone 19. As a result of this the occurrence of blooming can advantageously be prevented. Moreover, all the holes which are generated in spite of the presence of the potential barriers 27 — which form potential wells for holes — can be drained in that the holes which are generated in and/or near the barriers 27 can be drained via the adjoining isolation zone 7 which is connected to the substrate 21.

After picking up and integrating the radiation pattern 8 the charges which are stored in two adjacent potential wells 25 can be added to each other after which the device can be operated as a two-phase charge-coupled device to transport the charge to the reading means 10. During the transport the potential barrier 27 in the interruptions 20 can advantageously be increased, for example, by reducing the voltage applied to the drain zone 19, so as to prevent superfluous loss of charge. The voltage at the drain zone 19 can be reduced to approximately 15 volts, for example, via the connection terminal 80 which is shown diagrammatically in FIG. 2.

FIG. 8 shows a second embodiment of a charge-coupled device according to the invention. This device, the cross-section of which, which is shown in FIG. 8, corresponds to the cross-sections shown in FIG. 2 in the first embodiment is substantially equal to the charge-coupled device according to the preceding embodiment, apart from a small variation. For convenience, corresponding components are therefore referred to by the same reference numerals in both embodiments.

The charge-coupled device differs herein from the device according to the preceding embodiment in that the drain zone 19 is not formed by an n-type surface zone provided in the isolation zone 7, but by an island-shaped part 31 which is surrounded by the isolation zone 7 with the exception of the area of the interruptions 20 in the isolation zone 7. In order to reduce the resistance, a highly doped N±-type surface zone 32 may be provided in the island 31, for example, by means of diffusion of a suitable donor impurity. Said zone does not adjoin the isolation zone 7 and consequently has no or substantially no influence on the breakdown voltage of the p-n junction between the p-type isolation zone 7 and the n-type island 31.

The device may be manufactured and operated in a manner analogous to the charge-coupled device according to the preceding embodiment, in which the zone 7 (or the zones 7) also again serves as an isolation zone for the layers 2, as a means to obtain potential barriers 27 (see FIG. 7) across which excessive electrons can be drained and as a drain for generated holes.

FIG. 9 is a plan view of a part of an embodiment of a second type of charge-coupled device according to the invention.

The device which may be used inter alia again as a picture sensor (or pick up element) in camera tubes comprises a silicon body 41 having a number of adjacent semiconductor layers 42 of n-type silicon. Only four of said layers 42 each constituting a line of the sensor are shown in the figures.

The semiconductor layers 42 may be isolated from the surroundings with the aid of means including inter alia the isolating layer 44 of silicon oxide provided on the surface 43 of the body 41 as well as a p-n junction 45 on the sides of the semiconductor layers 42 present opposite to the surface 43. Said isolating means furthermore include p-type isolation zones 46 with which the layers 42 can be separated laterally by applying a sufficiently large reverse voltage to the zones 46. The said means in the present embodiment also include the electrodes 47 with which fields can be induced in the body 41 which adjoin the layers 42 laterally (see FIGS. 9, 10 and 11).

The sensor again belongs to the type of charge-coupled devices in which information in the form of majority charge carriers can be transported and/or stored mainly via the interior of the semiconductor layers 42. For that purpose each layer 42 has a thickness and a doping concentration at which a depletion zone can be obtained throughout the thickness of the layers 42 by means of an electric field while avoiding breakdown.

In addition to the electrodes 47, an electrode system is present on the surface 43 of the body 41 and comprises a number of electrodes which are arranged one behind the other and of which only the electrodes 52–58 are shown in FIGS. 9–13. Said electrodes are separated from the body 41 by the isolating layer 44, and from the electrodes 47 belonging to the isolating means, as is shown inter alia in FIGS. 10, 11 and 13.

Electric fields can be induced capacitively in the layers 42 by means of the electrodes so that potential wells which are separated from each other by potential barriers are formed locally in the layers 42. Information in the form of charge consisting of majority charge carriers which can be generated in the layers 42 under the influence of electromagnetic radiation, which is shown diagrammatically in FIG. 10 by the arrows 48 and is incident on the surface 43 of the body 41, may then be stored in said potential wells.

After picking up (intergrating) the radiation 48 further electric fields for transporting the charge through the layers 42 in a direction parallel to said layers to means 50 for reading the charge can be generated in the layers 42 by means of the said electrode system. In FIG. 9 said means 50 are shown diagrammatically only by a block diagram and may also comprise, for example, a charge-coupled storage matrix. The majority charge carriers generated in the layer 42 can be transported in said storage matrix 50 in the form of charge packets of which the size forms a measure of the quantity of radiation 48 which has locally been absorbed in the semiconductor layers 42 during the integration period, which is denoted diagrammatically by the arrows 51. While the charge packets are then read, for example, one by one, a new radiation pattern may be integrated in the semiconductor layers 42.

For clarity, the reading means 50 are not shown in the sectional views shown in FIGS. 12 and 13.

In order to prevent crosstalk between information packets in successive potential wells in the same semiconductor layer 42 in which as a result of local overexposure so many charge carriers are generated that the associated potential well is not only filled entirely but in which a number of electrons themselves spread over the layer and land in adjacent potential wells, the semiconductor body 41 comprises an n-type drain zone 59 for draining excessive electrons from the layers 42. The zone 59 forms a common drain zone for the layers 42 present on either side of said zone. It will of course be obvious that the device comprises several of such drain zones 59 inter alia in behalf of the layers 42 shown only diagrammatically in FIG. 9 on the left-hand and the right-hand, respectively of the figure, and which are not shown in the figures.

The drain zone 59 may be separated electrically from the adjoining layers 42 with the aid of the isolating means 47 with which a potential barrier (for electrons) can be formed between the layers 42 and the drain zone 59 and which is lower than the said potential barrier in a layer 42 between two successive potential wells in said semiconductor layer 42. This relatively low potential barrier may then serve as an overflow via which excessive electrons can be conveyed in the drain zone 59 instead of spreading over the semiconductor layer 42.

The semiconductor layers 42 and the drain zone 59 are separated laterally from each other by an n-type intermediate region 60 which therefore has the same conductivity type as the semiconductor layers 42 and the drain zone 59. The intermediate region 60 has a thickness and a doping concentration at which a depletion zone can be obtained throughout the thickness of the intermediate region by means of an electric field while avoiding breakdown.

Electrodes 47, hereinafter termed intermediate electrodes, are present on the surface 43 of the body 41 and are separated from the semiconductor material by the intermediately located oxide layer 44. By means of the electrodes 47 which are present above the intermediate regions 60, an electric field can be formed capacitively in the intermediate regions 60 so as to obtain the said potential barrier between the semiconductor layers 42 and the drain zone 59.

On the sides which, viewed on the surface 43, are present opposite to the drain zone 59, the semiconductor layers 42 are bounded by zones 46. Said zones from p-type isolation zones which, viewed on the surface 43, extend in the semiconductor body 41 beside the semiconductor layers 42 parallel to the direction of charge transport. As will become apparent hereinafter, generated minority charge carriers, so holes, can be drained via said isolation zone.

The semiconductor body 41 comprises an n-type surface layer which adjoins the surface 43 and is formed by the n-type epitaxial layer 62 having therein the semiconductor layers 42 and the drain zone 59. The epitaxial layer 62 is provided on a substrate 61 of p-type silicon which forms the p-n junctions 45 with the semiconductor layers 42.

As shown in FIGS. 9–11, two electrodes are provided on the surface 43 of the body 41 and are separated from the underlying semiconductor material by the isolating layer 44. Viewed on the surface 43, the electrodes extend substantially parallel to each other and to the drain zone 59 above the body 41. Viewed on the surface 43, the drain zone 59 is present between the electrodes 47 and can be isolated from adjoining parts of the epitaxial layer 62 by means of electric fields which can be generated by means of the electrodes 47 in the epitaxial layer 62 at the area of the regions. The drain zone 59 is then formed by an island-shaped part of the epitaxial layer 62 of which the upright walls are bounded by depletion zones which are formed by means of the electrodes 47. In order to reduce the resistance of the drain zone 59 an n$^+$-type surface zone 72 may be provided in the epitaxial layer.

FIG. 11 furthermore shows means comprising the voltage sources 49 with which voltages can be set up at the electrodes 47 and the p-type isolation zones 46 at which the surface potential (for holes) near the zones 46 is lower than the surface potential (for holes) below the electrodes 47 so that holes can flow in the direction from the drain zone 59 to the p-type zone 46 via the potential barrier (for electrons) in the semiconductor layer 42 and be drained via the zones 46.

The electrodes 52–58 form a common electrode system for the semiconductor layers 42 and extend over all the layers 42 in a direction transverse to the direction of charge transport. The electrodes 53, 55, 57 and so on which are shown in FIG. 9 by broken lines are formed by polycrystalline silicon layers which are embedded in the oxide layer 44 and are overlapped along the edges by the electrodes 52, 54, 56 and 58.

As shown in FIGS. 10 and 12, the electrodes 52, 54, 56 and 58 which consist of aluminum are present above more highly doped surface zones 74 provided in the epitaxial layer. The zones 74 which extend in the epitaxial layer 62 only over a comparatively small part of the thickness of said layer form on the one hand a large capacity together with the electrodes present above it and thus cause a favorable effect of the device. Since the zones 74 on the other hand are present only every alternate electrode, it is achieved in addition that the device can be operated as a two-phase system in which, for example, the electrodes 53, 54, 57, 58 are connected to a first clock voltage source and the electrodes 52, 55, 56 to a second clock voltage source so as to transport the charge through the layers 42.

The electrodes which belong to the insulating means and which are separated from the electrodes 52–58 by the oxide layer 44 may also be formed by layers of polycrystalline silicon.

For the manufacture of the device, methods which are generally known in semiconductor technology may be used. Starting material is the p-type substrate 61 whose thickness is approximately 200 $\mu$m and whose acceptor concentration is approximately $2 \times 10^{14}$ atoms/cm$^3$.

On the substrate 61 the n-type epitaxial silicon layer is grown with a thickness of approximately 5 $\mu$m and a donor concentration of approximately $6 \times 10^{14}$ atoms/ccm.

The p-type isolation zones 46 may be provided in the layer 62 by means of the conventional photomasking methods. The zones 46 may have surface concentrations between $10^{18}$ and $10^{19}$ atoms/ccm.

The electrodes 47 are then provided on the surface 43 of the epitaxial layer 62 by means of deposition of polycrystalline silicon on the isolating oxide layer 44 the thickness of which is approximately 0.1 $\mu$m. The electrodes 47 may be used as a mask for providing the low-ohmic n-type surface zone 72 which is shown in the plan view of FIG. 9 as a dot-and-dash line. The zone 72 may have a surface concentration between $10^{19}$ and $10^{20}$ atoms/ccm.

By slightly oxidizing the electrodes 47, an oxide layer can be obtained in which the electrodes 47 are embedded substantially entirely. The electrodes 53, 55, 57 which also consist of polycrystalline silicon layers and which may then be provided are isolated thereby from the electrodes 47.

The electrodes 53, 55, 57 may again be used as a mask in the subsequent doping step in which the n-type surface zones 54 are provided by means of ion implantation and which, viewed on the surface 43, are present between the electrodes 53, 55, 57.

The thickness and the doping concentration of the surface zones 74 are approximately 0.5 $\mu$m and approximately $10^{16}$ atoms/ccm, respectively. With these thickness and doping concentrations, each time the greater part of the information-forming charge can be stored in the regions 74 and hence near the surface 43, while also the charge transport takes place for the greater part at or near the surface and only the last residue of charge still to be siphoned can be displaced at a larger distance from the surface.

After providing the surface zones 74, the electrodes 52, 54, 56, 58 may be provided by depositing layers of aluminum. The electrodes 53, 55, 57 on the one hand and the electrodes 52, 54, 56, 58 on the other hand are isolated from each other by an intermediate oxide layer which can be obtained, for example, by slightly oxidizing the polycrystalline silicon electrodes 53, 55, 57 prior to depositing the aluminum.

The operation of the charge-coupled device according to the present embodiment will now be described in greater detail with reference to the FIGS. 14, 15 and 16. These figures show the variation of the potential $\phi$ as a function of the coordinates $x$ and $y$, in which $x$ (see FIG. 14) represents a place along the line XII—XII in FIG. 9. In FIG. 15 $y$ denotes a place along the line X—X and in FIG. 16 a place along the line XI—XI in FIG. 9.

The potential of the substrate 61 is considered as a reference level and for convenience is assumed to be equal to 0 volt. As in the preceding embodiment, voltages are applied to the semiconductor layers 42 and to the electrodes 52–58 and are approximately +20 volts and +10 volts, respectively. At these voltages the semiconductor layers are depleted throughout their thickness. The potential minimum (for electrons) at these voltages lies at a distance of approximately 2 $\mu$m from the surface 43. At said depth the potential $\phi$ below the electrodes 52, 54, 56, 58 proves to be approximately 4 volts lower as a result of the regions 74 than below the electrodes 53, 55, 57. In this manner the potential variation shown in FIG. 14 is obtained with potential wells 65 below the aluminum electrodes and with potential barriers 68 below the polycrystalline silicon electrodes.

In order to prevent spreading of electrons as a result of local overexposure, the potential barrier for electrons between the semiconductor layers 42 and the drain zone 59 should be slightly lower than 4 volts. In the present embodiment in which the semiconductor region 60 below the electrodes 47 is of the same composition as the semiconductor region below the electrodes 53, 55, 57 consisting of the semiconductor material of the epitaxial layer, a potential barrier of the desired height can be obtained by applying a voltage of between +10 volts and +15 volts, for example a voltage of 10.4 volts, to the electrodes 47. As a result of this the potential barrier 67 for electrons due to the electrodes 47 will be slightly lower than the potential barrier 68 below the electrodes 53, 55, 57 and be, for example, approximately 3.8 volts.

FIG. 15 shows the potential pattern which is obtained in this manner along the line X—X of FIG. 9. In this figure, the potential wells in the semiconductor layers 42 are denoted again by 65. Said wells are bounded on the left-hand side and on the right-hand side of figure by high potential barriers 66 which can be obtained by means of the isolation zone 46, for example, by connecting said zones to the substrate 61.

On the inside the potential wells 65 are bounded by the relatively low potential barriers 67 which are obtained by means of the electrodes 47 and which show a height of approximately 3.8 volts and hence are approximately 0.2 volt lower than the potential barriers 68 which form a separation between two successive potential wells 65 in the same layer 42 in the charge transfer direction. As a result of this, excessive electrons of an entirely filled potential well 65 which cannot flow via the potential barrier 68 in adjacent potential wells, are bonveyed via the lower potential barrer 67 in the drain zone 59, and are drained there. As a result of this, blooming can be prevented. By applying thereto a suitable potential, the drain zone 59 can be adjusted in a simple manner at which a potential that the deep potential well 69 is obtained in which, if desired, the height of the barrier 67 can still be varied via the potential of the drain zone 59.

In the present embodiment the semiconductor layers 42 are bounded on one side, namely below the electrodes 47, by depletion zones instead of by more conventional isolation zones of the opposite conductivity type. At first sight, such an isolation which on one side is formed entirely by a depletion region seems to present difficulties in a charge-coupled device of the described type as regards a satisfactory drain of generated minority charge carriers. Since the potential barrier 67 corresponds to a potential well for holes, holes which are generated below the electrodes 47 or near the potential wells 65 will be attracted by the electrodes 47.

Since, however, the electrodes 53, 55, 57 are at a negative voltage relative to the electrodes 47, said holes may then be attracted by the electrodes 53, 55, 57 and then be drained by the isolation zones 46 which have the most negative potential as a result of the voltage sources 49. For illustration, FIG. 16 shows the variation of the surface potential $\phi$ along the line XI—XI of FIG. 9 in which it should be noted that the potential for holes is equal to $-\phi$.

After picking up (integrating) the electromagnetic radiation 48 the charge packets stored in the potential wells can be added together two by two after which the device can be operated as a two-phase charge-coupled device so as to transport the charge to the reading means 50 as is described inter alia in the already mentioned prior Patent application Ser. No. 450,996. The potential barrier can in this case advantageously be increased, for example, by decreasing the voltage applied to the drain zone 59 so that superfluous loss of charge during the transport can be avoided. In the present embodiment such an increase can be obtained more simply by reducing the voltage at the electrodes 47 to a suitable value via the connection terminals 81 shown diagrammatically in FIG. 11.

It will be obvious that the invention is not restricted to the embodiments described but that many variations are possible to those skilled in the art without departing from the scope of the this invention.

For example, instead of semiconductor layers having a profiled doping concentration, semiconductor layers having, for example, a uniform doping concentration may also be used. A charge-coupled device having such a semiconductor layer may be operated as a three-phase system or as a two-phase system, in which the necessary asymmetry in the system is obtained by means of external voltage sources.

Instead of in two-dimensional pick-up elements having a number of juxtaposed semiconductor layers, the invention may also be used advantageously in, for example, a uni-dimensional, or linear picture-pick up element.

It will furthermore be obvious that instead of the said materials, or materials of the said compositions, other suitable materials or compositions may also be used. For example, the conductivity types in the embodiments may be reversed in which the polarities of the potential differences to be applied should, of course, also be reversed. In addition, said semiconductor layers, instead of being formed by islands in an epitaxial layer, may also be obtained, for example, by ion implantation.

In the embodiments described the devices were operated so that during the integration of the radiation pattern the generated majority charge carriers are stored in the interior and at a finite distance from the surface of the body. The devices may also be operated so, however, that the majority charge carriers are stored at least partly at the surface. In order to explain this, FIG. 17 shows diagrammatically a part of a charge-coupled device according to the invention which as regards structure may be substantially equal to the device according to any of the preceding embodiments. For clarity, corresponding parts in said figure are referred to by the same reference numerals as in the first embodiment.

The device comprises an n-type semiconductor layer 2 which is formed by an island-shaped part in the n-type epitaxial layer 22 provided on the p-type substrate 21. The figure furthermore shows the electrode 80 separated from the layer (2, 22) by the oxide layer 4 and which may form one of the electrodes 12-18 in the first embodiment. The figure furthermore shows the electric connections 81 to the electrode 80 and the electric connection 82 to the substrate 21. For example, together with voltage sources not shown said connections form part of means to at least temporarily apply a voltage during the integration period, or at least before the generated majority charge carriers are transported to the said reading means, so that, viewed in the z-direction, the potential $\phi$ for electrons in the semiconductor layer (2, 22) at the area of the surface 3 shows a minimum as is denoted by the curves 90 and 91. Holes which are generated under the influence of electromagnetic radiation near the surface 3 (and of which the potential is denoted by $-\phi$) can flow directly via the semiconductor layer (2, 22) into the substrate 21 and be drained there.

In this embodiment the holes need not be conveyed into the substrate via a p-type isolation zone.

The curve 90 in FIG. 17, for example, represents the variation of the potential $\phi$ below one of the electrodes 12, 14, 16 and 18 at the area of a potential well in which information-forming electrons can be stored, while the curve 91 denotes the variation (in vertical direction) of the potential $\phi$ below the electrodes 13, 15, 17 at the area of a potential barrier in the semiconductor layer 2 which separates two successive potential wells.

The electrons stored in the potential wells 90 may at least temporarily adjoin the surface 3 and, if desired, can be displaced again to the interior of the layer 2 after the generated holes have flowed away to the substrate 22.

Excessive electrons which are generated by local overexposure can be drained via the channels 20 to the drain zone 19 in a manner analogous to that already described with reference to the first embodiment.

After the integration of the radiation pattern the information-forming charge can be transported to the reading means, for example, entirely via the interior of the semiconductor layer 2.

What is claimed is:

1. A radiant energy sensor of the bulk-channel charge coupled type with blooming suppression, comprising a semiconductor body having an elongated semiconductor layer of first type conductivity and serving as a storage and transfer signal channel for first type majority signal carriers generated by incident radiant energy, means for electrically isolating the layer from its surroundings, means including electrodes arranged adjacent a surface of the body and the signal channel and capable when the electrodes are electrically biased of forming a depletion zone throughout the channel thickness and of forming in the channel a series of potential wells having, within the channel and separated in the transfer direction by potential barriers, potential minima where majority carriers can be stored and further capable of transferring the carriers from well to successive well along the channel interior, and means for draining excess majority carriers comprising a semiconductor drain zone of a first type conductivity arranged in the body alongside the signal channel and directly connected to the signal channel and when electrical bias is applied cooperating with the electrical isolation means to establish between the drain zone and the storage wells an overflow potential barrier which maintains the electrical isolation of the signal channel but whose height at locations each adjacent a storage well is lower than that of the potential barrier between successive wells during storage thereby to preferentially attract excess majority carriers overflowing the storage wells, said isolating means comprising a semiconductor isolation zone of a second opposite-type conductivity which, viewed on the surface, extends in the semiconductor body parallel to and besides the signal channel and separates laterally the signal channel from the drain zone except for locallized channels of the first type conductivity which interconnect the signal channel and the drain zone, said channels having a thickness and a doping concentration at which a depletion zone can be established throughout its thickness by means of an electric field so as to obtain said overflow potential barrier.

2. A radiant energy sensor as claimed in claim 1 and further comprising means connected to the electrical isolation means for draining minority carriers formed in the signal channel by incident radiant energy.

3. A radiant energy sensor as claimed in claim 2 wherein the body comprises the first type channel layer on a second, opposite type substrate forming a P-N junction serving as part of the isolation means, the body being constructed and the applied potentials being such that before charge transport occurs said minority carriers formed at the signal channel surface are attracted via said first type channel layer to and can be drained away by the said second type substrate.

4. A radiant energy sensor as claimed in claim 1 and further comprising means for raising the overflow potential barrier during charge transport to prevent loss of majority carriers to the majority carrier drain means.

5. A radiant energy sensor as claimed in claim 1 wherein the signal channel is formed by a surface region of first type conductivity which adjoins the surface of the semiconductor body on a substrate of second type conductivity forming a PN junction, said isolation zone extending from the surface down into the said substrate.

6. A radiant energy sensor as claimed in claim 5 wherein the semiconductor body has a surface layer of first type conductivity on a substrate of second type conductivity, the signal channel being formed by an island-shaped elongated part of the surface layer and the said isolation zone being formed by a surface zone of the second type conductivity extending throughout the thickness of the surface layer and, viewed on the surface, having local interruptions which form the said channels between the signal channel and the drain zone, said drain zone also comprising a surface region of the body.

7. A radiant energy sensor as claimed in claim 6 wherein, viewed on the surface, said electrodes extend above the interruptions in the isolation zone so that the electric fields generated by said electrodes contribute at least partly to the formation of said overflow potential barrier.

8. A radiant energy sensor as claimed in claim 6 wherein the drain zone is formed by a surface zone of first-type conductivity surrounded in the semiconductor body by the isolating zone of the second-type conductivity with the exception of the area of the channels between the drain zone and the signal channel.

9. A radiant energy sensor as claimed in claim 6 wherein the drain zone also includes an island-shaped part of the surface layer which is surrounded by the isolation zone except at the area of said interruptions.

10. A radiant energy sensor of the bulk-channel charge coupled type with blooming suppression, comprising a semiconductor body having an elongated semiconductor layer of first type conductivity and forming plural storage and transfer signal channels for first type majority signal carriers generated by incident radiant energy, means for electrically isolating the signal channels from their surroundings, means including electrodes arranged adjacent a surface of the body and the signal channels and capable when the electrodes are electrically biased of forming a depletion zone throughout the channel thickness and of forming in the channels a series of potential wells having, within the channels and separated in the transfer direction by potential barriers, potential minima where majority carriers can be stored and further capable of transferring the carriers from well to successive well along the channel interior, and means for draining excess majority carriers comprising a common semiconductor drain zone of a first type conductivity arranged in the body between the signal channels and directly connected to the signal channels and when electrical bias is applied cooperating with the electrical isolation means to establish between the drain zone and the storage wells an overflow potential barrier which maintains the electrical isolation of the signal channels but whose height at locations each adjacent a storage well is lower than that of the potential barrier between successive wells during storage thereby to preferentially attract excess majority carriers overflowing the storage wells, said isolating means comprising in the body plural intermediate regions of first-type conductivity each separating a signal channel from the drain zone, each said intermediate region having a thickness and a doping concentration at which a depletion zone can be obtained throughout its thickness by means of an electric field, and further comprising, separate from the transfer electrodes, separate intermediate electrodes provided over each intermediate region and spaced from each other by means of which an electric field can be formed capacitively in each intermediate region so as to obtain the said overflow potential barrier between the adjacent signal channel and the drain zone, said isolating means further including a semiconductor zone of the second type conductivity extending in the body alongside and bounding each signal channel on the side, viewed on the surface, opposite to the said drain zone.

11. A radiant energy sensor as claimed in claim 10 wherein the isolating means includes an isolation zone of second type conductivity, and means for applying a voltage difference between each said intermediate electrode and the isolation zone such that minority charge carriers will flow from the drain zone to the isolation zone in a direction transverse to the direction of charge transport at the area of the said potential barrier present between two successive potential wells.

12. A radiant energy sensor as claimed in claim 10 wherein means are provided for applying a voltage to said each intermediate electrode during charge transport to raise the overflow potential barrier to prevent loss of majority charge carriers.

13. A radiant energy sensor is claimed in claim 10 wherein the body comprises the first type channel layer on a second, opposite type substrate forming a P-N junction serving as part of the isolation means, the body being constructed and the applied potentials being such that before charge transport occurs minority carriers formed at the signal channel surface are attracted via said first type channel layer to and can be drained away by the said second type substrate.

* * * * *

UNITED STATES PATENT AND TRADEMARK OFFICE
CERTIFICATE OF CORRECTION

PATENT NO. : 4028716
DATED : June 7, 1977
INVENTOR(S) : JOHANNES GERRIT VAN SANTEN ET AL It is certified that error appears in the above-identified patent and that said Letters Patent are hereby corrected as shown below:

Col. 2, line 60, change "divice" to -- device --.

Col. 4, line 36, change " . " to -- , --.

Col. 4, line 42, change "divice" to -- device --.

Col. 8, line 6, before "Serial No." insert -- Application --.

line 7, delete "application".

Col. 15, line 19, change "barrer" to -- barrier --; change "bonveyed" to -- conveyed --.

Signed and Sealed this

First Day of November 1977

[SEAL]

Attest:

RUTH C. MASON
Attesting Officer

LUTRELLE F. PARKER
Acting Commissioner of Patents and Trademarks